United States Patent
Yano et al.

(10) Patent No.: US 7,032,163 B2
(45) Date of Patent: Apr. 18, 2006

(54) ERROR CORRECTION DECODER FOR TURBO CODE

(75) Inventors: Takashi Yano, Tokorozawa (JP); Tsuyoshi Tamaki, Hachioji (JP)

(73) Assignee: Hitachi, Ltd., Tokyo (JP)

(*) Notice: Subject to any disclaimer, the term of this patent is extended or adjusted under 35 U.S.C. 154(b) by 225 days.

(21) Appl. No.: 09/931,252

(22) Filed: Aug. 17, 2001

(65) Prior Publication Data

US 2003/0014712 A1    Jan. 16, 2003

(30) Foreign Application Priority Data

Jul. 6, 2001    (JP) ............................... 2001-205542

(51) Int. Cl.
    *H03M 13/03*    (2006.01)
(52) U.S. Cl. .................. 714/786; 714/780; 714/755
(58) Field of Classification Search ........ 714/786–796, 714/755, 780
    See application file for complete search history.

(56) References Cited

U.S. PATENT DOCUMENTS

| | | | | |
|---|---|---|---|---|
| 4,903,262 | A * | 2/1990 | Dissosway et al. ........ | 370/341 |
| 5,230,003 | A * | 7/1993 | Dent et al. ................. | 714/794 |
| 5,970,085 | A * | 10/1999 | Yi ............................. | 370/342 |
| 5,978,414 | A * | 11/1999 | Nara .......................... | 375/225 |
| 6,510,536 | B1 * | 1/2003 | Crozier et al. ............. | 714/755 |
| 6,526,539 | B1 * | 2/2003 | Yano et al. ................ | 714/786 |
| 6,532,249 | B1 * | 3/2003 | Hwang ...................... | 375/146 |
| 6,557,139 | B1 * | 4/2003 | Böhnke ...................... | 714/758 |
| 6,574,775 | B1 * | 6/2003 | Chouly ....................... | 714/800 |
| 2001/0052104 | A1 * | 12/2001 | Xu et al. .................... | 714/792 |
| 2002/0056065 | A1 * | 5/2002 | Jung et al. ................. | 714/758 |
| 2002/0168033 | A1 * | 11/2002 | Suzuki et al. .............. | 375/341 |
| 2003/0005388 | A1 * | 1/2003 | Fukumasa .................. | 714/786 |
| 2003/0023919 | A1 * | 1/2003 | Yuan et al. ................. | 714/755 |
| 2003/0033571 | A1 * | 2/2003 | Bohnke ...................... | 714/758 |

FOREIGN PATENT DOCUMENTS

| | | |
|---|---|---|
| EP | 000973292 A2 * | 1/2000 |
| JP | 200153624 | 2/2001 |
| WO | 0161867 | 8/2001 |

OTHER PUBLICATIONS

Leung et al., Reducing Power Consumption of Turbo Code Detector Using Adaptive Iteration ith Variable Supply Voltage, Aug. 16-17, 1999, 1999 International Symposium on Low Power Electronics and Design, pp. 36-41.*

Shibutani et al., reducing average number of turbo decoding iterations, Apr. 29, 1999, Electronics Letters, pp. 701-702.*

(Continued)

*Primary Examiner*—Guy J. Lamarre
(74) *Attorney, Agent, or Firm*—Mattingly, Stanger, Malur & Brundidge, P.C.

(57) ABSTRACT

To provide a turbo decoder reducing power consumption by reducing an operational processing amount while ensuring sufficient error correction capability, there is provided a constitution including an input signal memory for storing turbo-coded received data, a decoder for executing SOVA decoding, a decoded result memory for storing a decoded result, a control block for executing repeated decoding, a memory stored with an interleave pattern, and judging means for judging reliability of a decoded result and the reliability of the decoded result is judged based on a soft decision value outputted from the SOVA decoder and when desired reliability is satisfied by the judgment result, the repeated decoding is finished.

5 Claims, 17 Drawing Sheets

OTHER PUBLICATIONS

Kwon et al., A modified two-step SOVA-based turbo decoder for low power and high performance, Sep. 15-17, 1999, Proceedings of the IEEE Region 10 Conference TENCON 99, vol. 1, pp. 297-300.*

Schurgers et al. "Adaptive turbo decoding for indoor wireless communication; 1998 URSI International Symposium on Signals, Systems, and Electronics, ISSSE 98, pp: 107-111; Oct. 2, 1998".*

* cited by examiner

[WHEN THE ITERATION NUMBER OF DECODING IS ODD]

[WHEN THE ITERATION NUMBER OF DECODING IS EVEN]

ERROR CORRECTION DECODER FOR TURBO CODE

CROSS-REFERENCE TO RELATED APPLICATION

The present application is related to application Ser. No. 09/934,601, filed Aug. 23, 2001, by T. Inoue et al., entitled "TURBO DECODER AND RADIO BASE STATION WITH TURBO DECODER AND TURBO ENCODER".

BACKGROUND OF THE INVENTION

The present invention relates to a turbo decoder for receiving turbo-coded data for error correction in a communication system, correcting transmission data error and decoding the data.

In a communication system, there are adopted various error correction encoding systems for remedy of transmission data error. For example, as described in K. Yamaguchi et al., "Novel coding algorithm closing to Shannon's limit (Turbo code)", Nikkei Electronics No. 721, pp. 163–177 issued on Jul. 13, 1998 in Japan, there is known a turbo encoding system as an encoding system having high error correction capability.

According to a communication system adopting a turbo encoding system shown in FIG. 18, there are prepared two recursive and systematic convolutional encoders in a turbo encoder 201 and at a first convolutional encoder 204, signals of an information source are encoded in the order of input. Before inputting signals to a second convolutional encoder 206, the signals of the information source are temporarily stored in a memory and by an interleaver 205 for taking out the signals in an order in accordance with a certain pattern, the order of data bits are arranged and the signals are encoded by the convolutional encoder 206. Turbo encoded data $U_T$, $Y_T1$ and $Y_T2$ are multiplexed into one channel and transmitted from the two encoded outputs to a communication channel 202. Encoded data $U_R$, $Y_R1$ and $Y_R2$ having passed through the communication channel 202 are inputted to a turbo decoder 203, where decoded data $U_O$ is obtained by processing a turbo decoding.

The turbo decoder 203 includes two decoders 207 and 209, two interleavers 208 and 211 and a de-interleaver 210. When received data $U_R$, $Y_R1$ are put into the decoder, the decoder carries out soft output decoding. Further, received data $Y_R2$ corresponds to the transmitted data $Y_T2$ constituted by interleaving and convolutionally encoding an original signal X, and the interleaver 208 interleaves decoded data of the decoder 207 to correspond to the received data $Y_R2$, and interleaved data are put into the decoder 209 and soft output decoding is executed. The de-interleaver 210 deinterleaves an output of a decoded result to be in the order of original data to thereby provide the decoded output $U_O$. The decoded output $U_O$ is put again into the decoder 207 as received data $U_R$ and the operation mentioned above is repeated. By carrying out the decoding processing repeatedly, randomly generated error or error generated in burst can be corrected. As a decoding system of the decoders 207 and 209, a MAP (maximum a posteriori probability) decoding system or a SOVA (soft-output Viterbi algorithm) decoding system is well known. Further, the decoders 207 and 209 are constructed by the same constitution and therefore, actually, a single decoder is frequently used to alternately switch for the decoder 207 (for example, for odd number times) and for the decoder 209 (for example, for even number times).

According to the above-described turbo decoder, by increasing an iteration number of the decoding processing, the correction capability is promoted and errors can be reduced even in a communication channel having poorer quality. However, when the iteration number is increased, an operational processing amount is increased, a higher clock frequency is needed and power consumption is increased.

Particularly, in a mobile station, it is important to restrain power consumption as small as possible to thereby ensure to drive the mobile station for a long period of time by a battery. According to IMT-2000 (International Mobile Telecommunication systems) constituting international standards of a mobile communication system, application of the turbo code is prescribed and in a mobile station in conformity with IMT-2000, there is required a turbo decoder having sufficient error correction capability and small power consumption.

It is an object of the invention to provide a turbo decoder reducing power consumption by reducing a processing amount while ensuring sufficient error correction capability.

In order to achieve the above-described object, a turbo decoder according to the invention is characterized in comprising means for judging a reliability of a decoded result based on statistics of a result of soft output decoding in a decoder and controlling means for controlling the decoder to execute a decoding operation successively repeatedly when a result of judging the reliability of the means for judging the reliability does not satisfy a desired reliability and stop the decoding operation and output a decoded result when the desired reliability is achieved.

The decoding operation which has conventionally been executed continuously by a predetermined number of times regardless of presence or absence of the reliability, is stopped at a middle stage achieving the reliability and accordingly, the processing amount is reduced and the power consumption is reduced in accordance therewith.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

Figure 1:
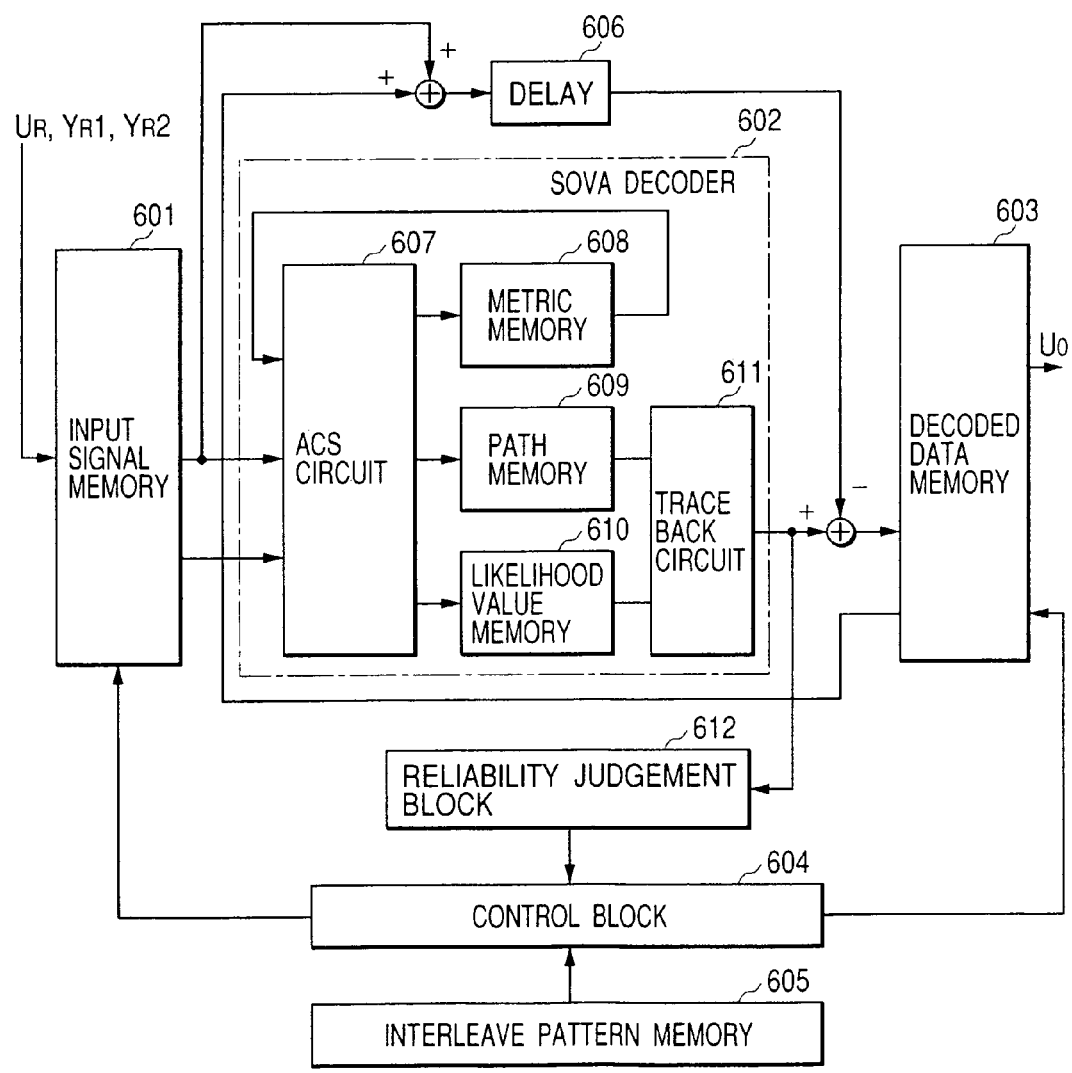
FIG. 1 is a constitution diagram for explaining an embodiment of the invention of a turbo decoder according to the invention.

A further detailed explanation will be given as follows of a turbo decoder according to the invention in reference to embodiments of the invention shown in the drawings.

In FIG. 1, a turbo decoder according to the invention includes an input signal memory 601 for inputting encoded data $U_R$, $Y_R1$ and $Y_R2$ received via a communication channel and storing the data of information bit length, an SOVA decoder 602 for inputting the encoded data $U_R$, $Y_R1$ and $Y_R2$ read from the input signal memory 601 and executing a decoding operation by a soft-output Viterbi algorithm, a decoded data memory 603 for storing a result of a soft decision output and a hard decision output provided by decoding as a decoded output of the SOVA decoder 602, a reliability judgment block 612 for judging reliability of the decoded result from statistics of the soft decision output result from the SOVA decoder 602, a control block 604 for controlling a number of times of executing repeated operation and controlling operation of respective portions in accordance with an iteration number and an interleave pattern memory 605 for storing an interleave pattern.

The received turbo-coded data $U_R$, $Y_R1$ and $Y_R2$ stored in the input signal memory 601 are successively read by the control of the control block 604 or read in accordance with an interleave rule stored to the interleave pattern memory 605. Further, the result of decoding at a preceding time stored in the decoded data memory 603 are put into the SOVA decoder 602 repeated decoding with exception of the first time. The SOVA decoder 602 outputs a new decoded result based on data from the input signal memory 601 and data from the decode data memory 603.

Meanwhile, the data from the input signal memory 601 and the data from the decoded data memory 603 are added to each other and delayed at a delay 606 by an amount of a decoding process delay time period of the SOVA decoder 602. Successively, an output value of the delay 602 is subtracted from the decoded result of the SOVA decoder 602 and a subtracted result is successively stored to the decoded data memory 603 by the control of the control block 604 or in accordance with the interleave rule stored to the interleave pattern memory 605.

Further, the decoded result of the SOVA decoder 602 is put into the reliability judgment block 612, the reliability of the decoded result is judged and the judgment result is put into the control block 604. The control block 604 determines either of executing repeated decoding successively or finishing the decoding operation based on the judgment result. That is, the control block 604 stops decoding when the judgment result satisfies desired reliability, and continues the decoding operation when the judgment result does not satisfy the desired reliability. Further, even in the case in which the judgment result does not satisfy the desired reliability, when a predetermined number of times of decoding is reached, the decoding is stopped.

Figure 2:
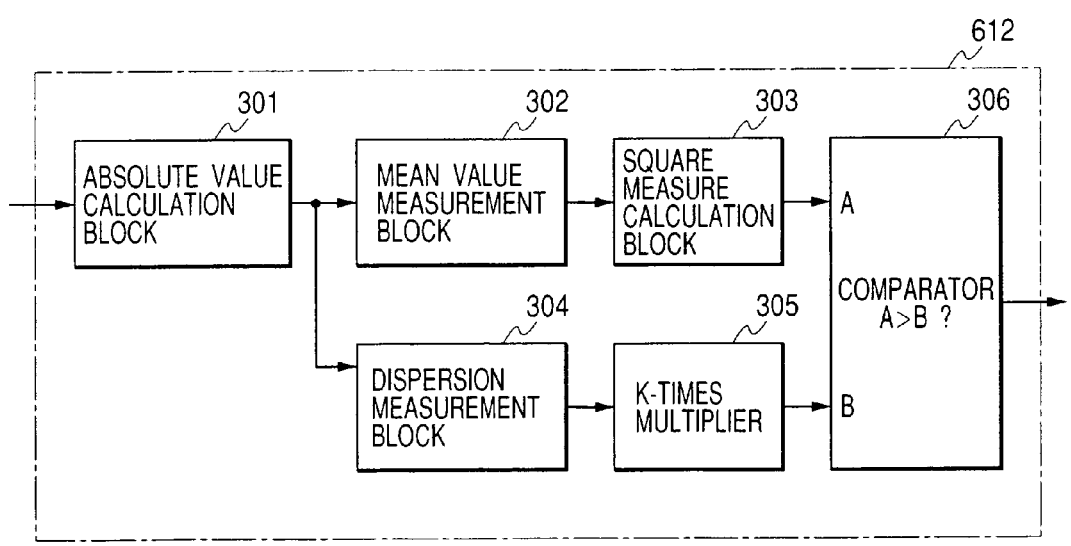
FIG. 2 is a constitution diagram for explaining a first example of a reliability judgment block used in the turbo decoder shown by FIG. 1.

FIG. 2 shows a first constitution example of the reliability judgment block 612 according to the embodiment. The result of the soft output decoding outputted from the SOVA decoder 602 is put into the reliability judgment block 612 and an absolute value is obtained by an absolute value calculation block 301. Thereafter, a square of a mean value of the result of the soft output deciding is calculated at a means value measurement block 302 and a square measure calculation block 303. When the result of the soft output decoding is regarded as a kind of signal, a result of the calculation corresponds to power of the signal. Further, with regard to the result of the soft output decoding formed by the absolute value outputted by the absolute value calculation block 301, a dispersion value thereof is further measured by a dispersion measurement block 304. A result of the calculation similarly corresponds to noise power.

The measured dispersion value is multiplied by a coefficient (K) determined in accordance with the desired reliability at a K-times multiplier block 305 and is compared with the square of the mean value at a comparator 306. When the square of the mean value is larger than the dispersion multiplied by K, there is outputted a result of judgment indicating that the desired reliability is achieved. In a case other than the above-described, there is outputted a result of judgment indicating that the desired reliability is not satisfied.

Figure 3:
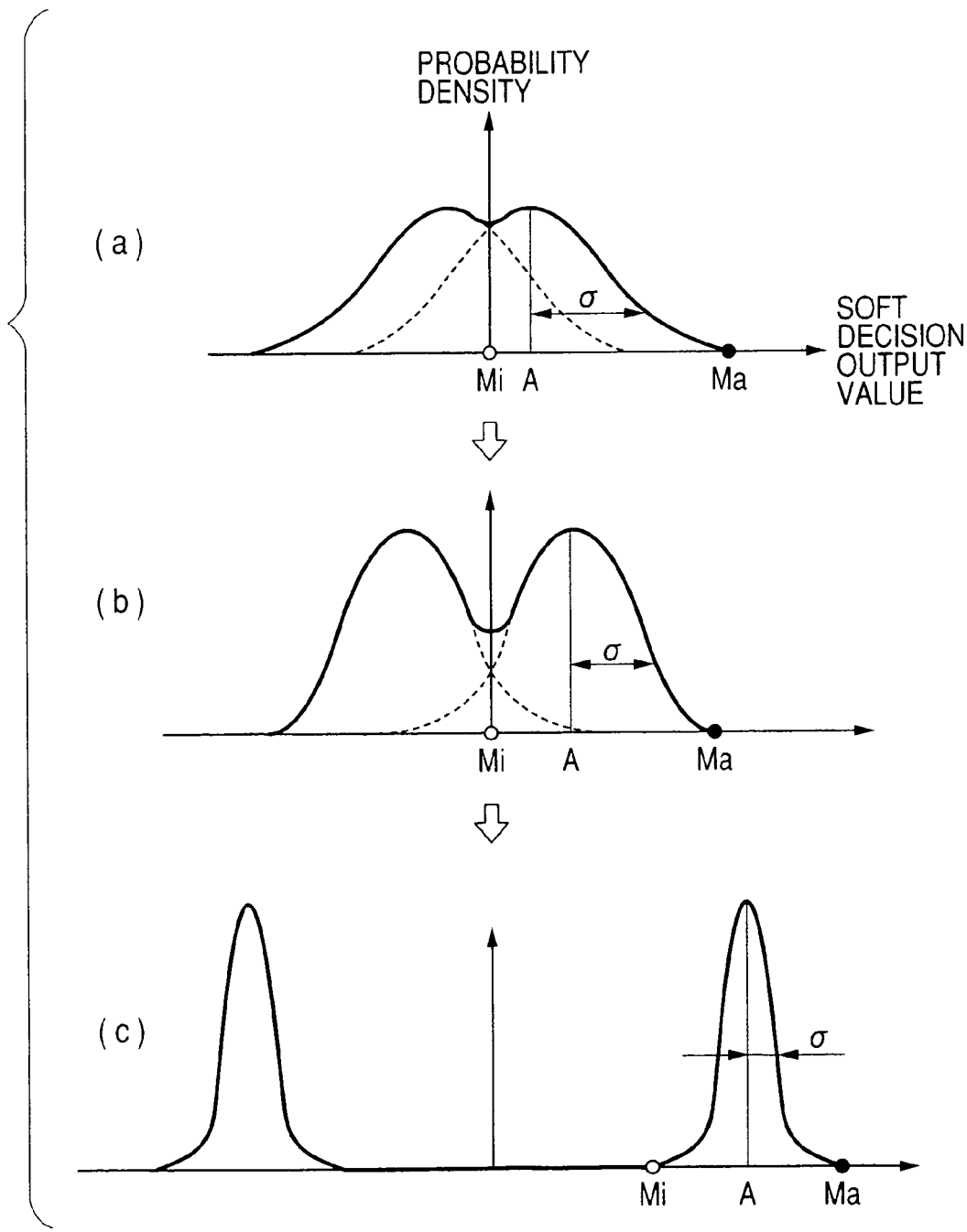
FIG. 3 is a curve diagram for explaining a relationship between a result of soft output decoding and reliability with regard to an iteration number of decoding.

FIG. 3 shows a transitional change of the decoded result provided by the above-described calculation. When the abscissa designates a value of the result of the soft output decoding and the ordinate designates a probability distribution, at start time point of decoding shown by (a) of FIG. 3, a dispersion value is large relatively to a means value A since the iteration number is deficient and therefore, the reliability is low and a differentiation between "1" and "0" of data is not clear. In (c) of FIG. 3 having a sufficient iteration number after a middle stage of (b) of FIG. 3, the dispersion value is very small relative to the average value A and accordingly, the reliability is increased and the differentiation between "1" and "0" of data becomes clear.

Figure 4A:
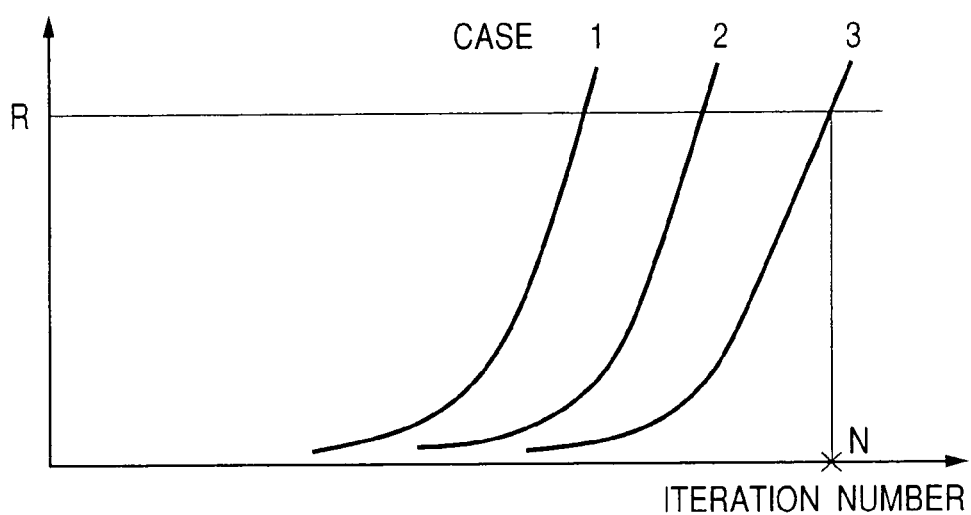
FIGS. 4A and 4B are curve diagrams for explaining a relationship between an iteration number of decoding and reliability.
Figure 4B:
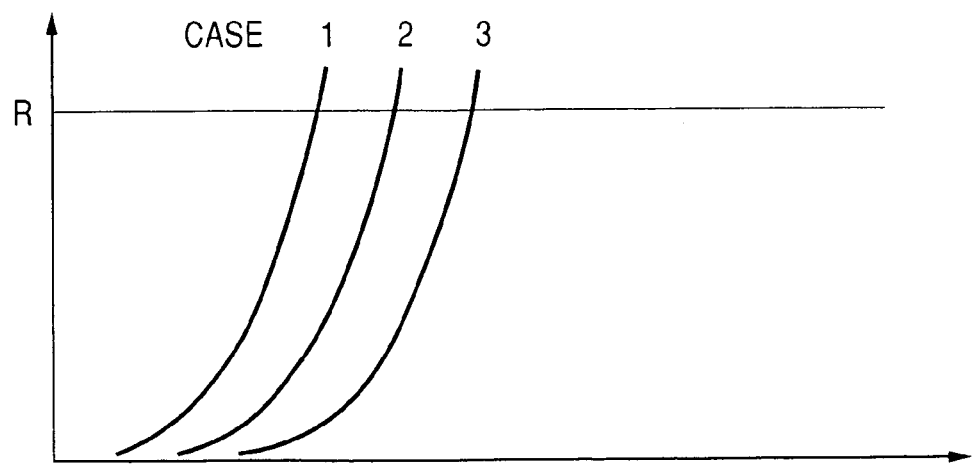

What number of iteration to achieve the high reliability shown by (c) of FIG. 3 is not unconditionally determined depending on a signal-to-noise ratio of the communication channel or cases with regard to data. The behavior is shown by FIGS. 4A and 4B. FIG. 4A shows a case in which the signal-to-noise ratio of the communication channel is small, showing that when the abscissa designates the iteration number and the ordinate designates the reliability, it is necessary to increase the iteration number to achieve the desired reliability R when the signal-to-noise ratio is small. FIG. 4B shows a case in which the signal-to-noise ratio of the communication channel is large, showing that the desired reliability R is achieved by a small iteration number.

Conventionally, the probable worst case is assumed, the iteration number N necessary for the case is set and the iteration number is fixed by N regardless of cases or the signal-to-noise ratio. According to the invention, the iteration number is determined by whether the reliability R is achieved and on an average, the iteration number can significantly be reduced.

Figure 5:
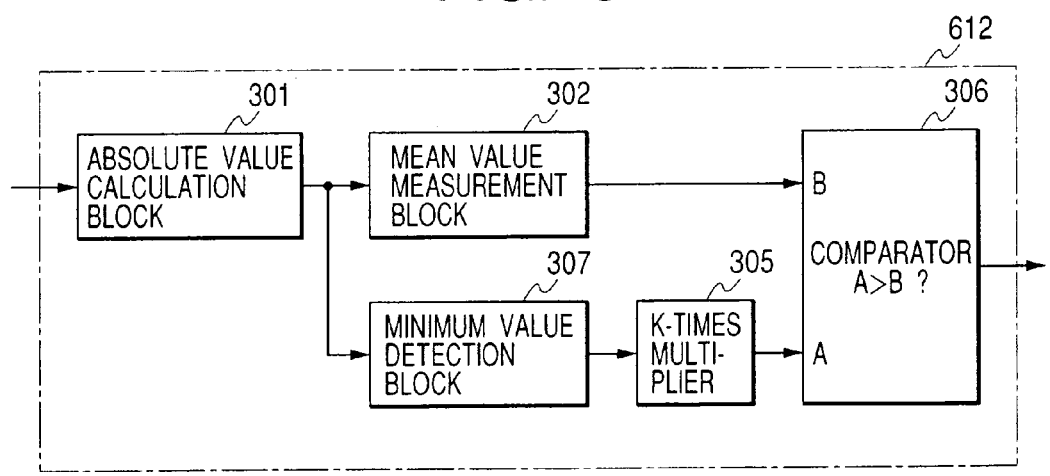
FIG. 5 is a constitution diagram for explaining a second example of a reliability judgment block used in the turbo decoder shown by FIG. 1.

The reliability determining block 612 is constituted by a second constitution example shown in FIG. 5 other than the above-described constitution. The absolute value calculation circuit 301 and the means value measurement block 302 operate similar to FIG. 2. A minimum value detection block 307 detects a minimum value in the absolute value of the result of the soft output decoding. The detected minimum value is multiplied by a coefficient (K) determined in accordance with the desired reliability at the K-times multiplier block 305 and is compared with the mean value outputted by the mean value measurement block 302 at the comparator 306. In this case, it seems that the smaller the minimum value than the average value, the lower the reliability of the decoded result and accordingly, when the minimum value multiplied by K is larger than the average value, there is outputted a result of judgment indicating that the desired reliability is achieved. In a case other than the above-described, there is outputted a result of judgment indicating that the desired reliability is not satisfied.

In FIG. 3, notation Mi designates a minimum value and the minimum value becomes 0 in (a) and (b) of FIG. 3, however, in (c) of FIG. 3, the minimum value is increased and it is known that the reliability is high.

Figure 6:
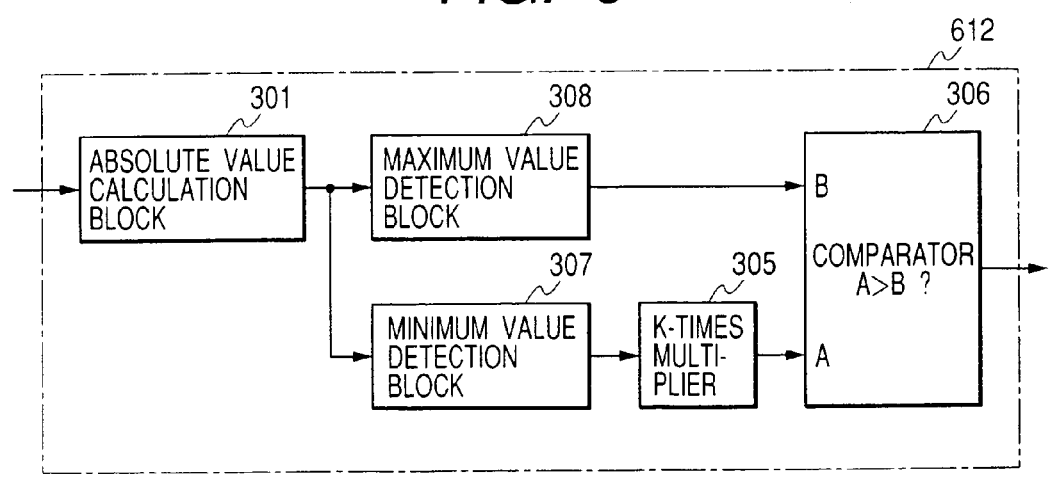
FIG. 6 is a constitution diagram for explaining a third example of a reliability judgment block used in the turbo decoder shown by FIG. 1.

Further, the reliability judgment block 612 can also be constituted by a third constitution example shown by FIG. 6 other than the above-described constitution. The absolute value calculation block 301, the minimum value detection block 307, the K-times multiplier block 305 and the comparator 306 operate similar to FIG. 3. According to the constitution, in place of the means value of FIG. 3, there is used a maximum value in the absolute value of the result of soft output decoding detected by a maximum value detection block 308. Similar to the second constitution example, it seems that the smaller the minimum value than the maximum value, the lower the reliability of the decoded result and accordingly, when the minimum value multiplied by K is larger than the maximum value, there is outputted a result of judgment indicating that the desired reliability is achieved. In a case other than the above-described, there is outputted a result of judgment indicating that the desired reliability is not satisfied.

In FIG. 3, notation Ma designates a maximum value, in (a) and (b) of FIG. 3, the minimum value Mi is smaller than the maximum value Ma, however, in (c) of FIG. 3, the minimum value Mi and the maximum value Ma become proximate to each other and it suggests that the reliability is high.

As described above, the statistic amounts of the mean value, the dispersion value, the minimum value and the maximum value of the result of the soft output decoding are used for the judgment, however, the judgment can be carried out also by using other statistic amount representing the probability distribution of the value of the result of the soft output decoding.

Figure 7A:
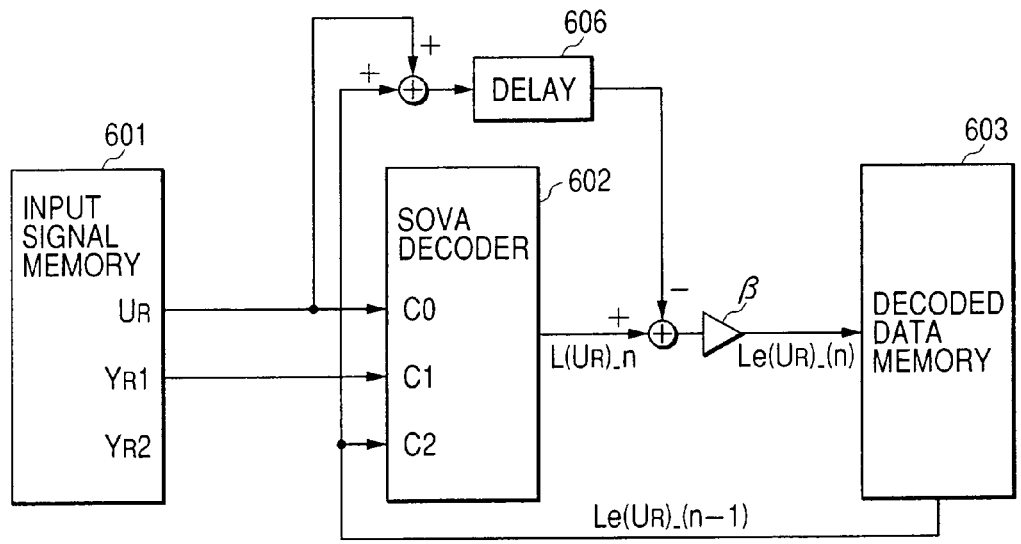
FIG. 7A is a diagram for explaining operation of repeated decoding at an odd number time of the turbo decoder shown by FIG. 1.

Successively, an explanation will be given of a flow of data controlled by the control block 604 in reference to FIGS. 7A and 7B. According to a processing of the repeated decoding at an odd number time shown by FIG. 7A, a value of reading $U_R$ in an address order from the input signal memory 601 stored with turbo-encoded data received via a communication channel, is used as C0 of an input of the SOVA decoder 602 and a value reading $Y_R1$ in an address order is used as C1. Further, a result of reading the decoded data memory 603 (A priori Information) is used as C2. An output $L(U_R)\_n$ of the SOVA decoder 602 is subtracted by a priori information $Le(U_R)\_(n-1)$ and the communication channel value $U_R$ and thereafter written to the decoded data memory 603 in an address order as Extrinsic Information $Le(U_R)\_n=\beta\times\{L(U_R)\_n-U_R-Le(U_R)\_(n-1)\}$. At an initial time of the repeated decoding, a priori information $Le(U_R)\_(n-1)$ is set to 0. Here, notation $\beta$ designates a coefficient weighting the reliability with regard to a soft decision value and influences on the characteristic of the correction capability. The coefficient $\beta$ can be controlled adaptively by measuring a noise state of the communication channel from a bit error rate of the error correction capability.

Figure 7B:
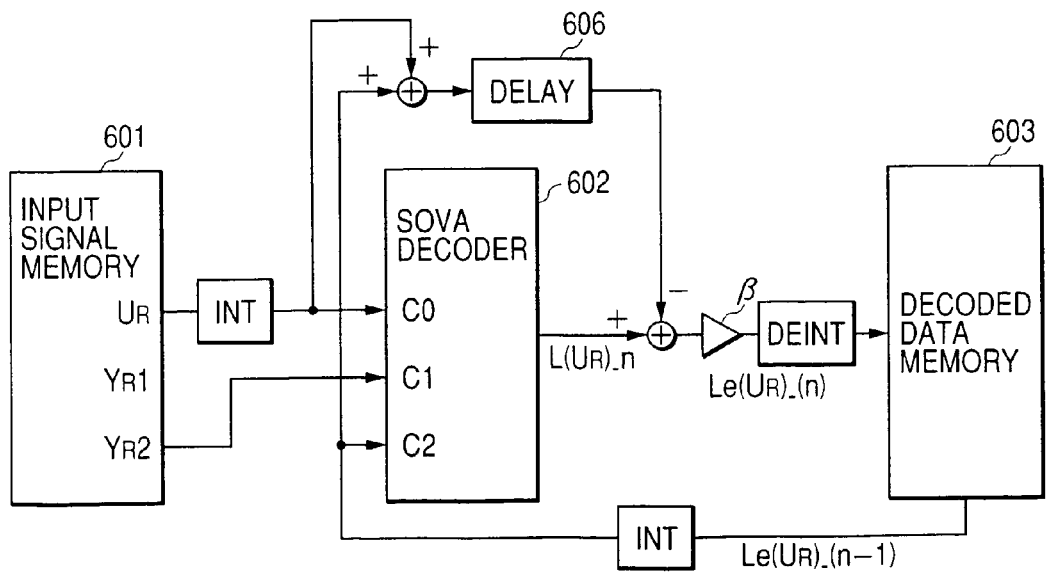
FIG. 7B is a diagram for explaining operation of repeated decoding at an even number time of the turbo decoder shown by FIG. 1.

Next, according to a processing of the repeated decoding at an even number time shown by FIG. 7B, a value $U_R$ read from the input signal memory 601 in accordance with the interleave rule, is used as C0 of the input of the SOVA decoder and a value $Y_R2$ read in an address order is used as C1. As the a priori information $Le(U_R)\_(n-1)$, there is used a value reading the extrinsic information provided by decoding at a preceding time from the decoded data memory 603 in accordance with the interleave rule. The a priori information is used as C2 of the input of the SOVA decoder, the output $L(U_R)\_n$ of the SOVA decoder 602 is subtracted by the a priori information $Le(U_R)\_(n-1)$ and the communication channel value $U_R$ and thereafter written to the decoded data memory 603 as the extrinsic information $Le(U_R)\_n=\beta\times\{L(U_R)\_n-U_R-Le(U_R)(n-1)\}$ by an address in accordance with the interleave rule and is deinterleaved thereby. The delay 606 is a circuit for delaying a sum of adding C0 and C2 of inputs of the SOVA decoder 602 until the output $L(U_R)\_n$ of the SOVA decoder 602 is calculated, and the output of the delay 606 is fixed to 0 at a final time of the repeated decoding.

The turbo decoder according to the embodiment repeats alternately operation of decoding at an odd number time and decoding at an even number time by a number of times by the control of the control block 604.

Figure 8:
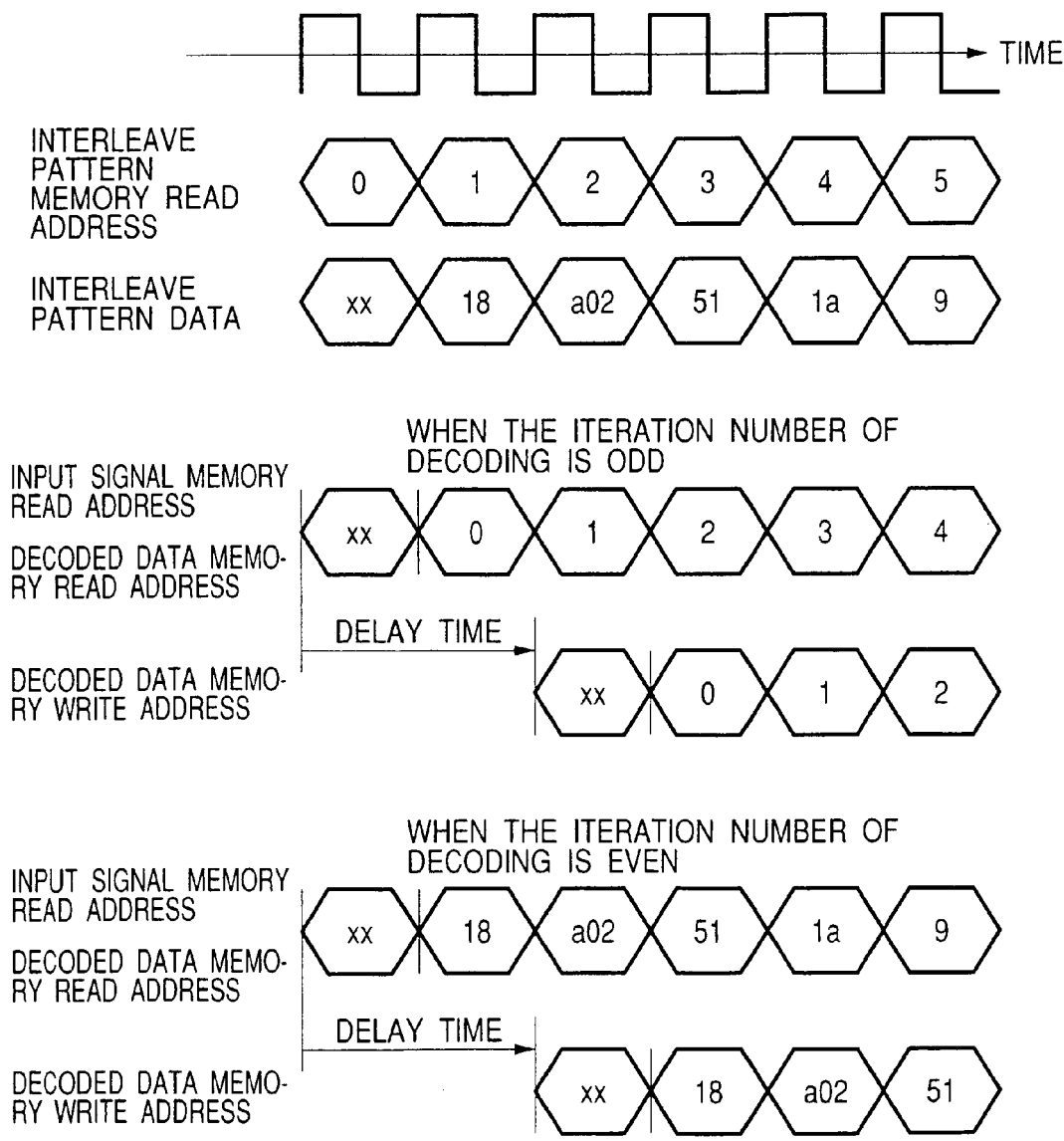
FIG. 8 is a diagram for explaining timings of the repeated decoding operation of the turbo decoder shown by FIG. 1.

Successively, an explanation will be given of operation of the control block 604 and the interleave pattern memory 605 in executing the repeated decoding in reference to FIG. 8. In the repeated decoding at odd number times, a read address of the input signal memory and a read address and a write address of the decoded data memory are constituted by an address order incremented by one by one and therefore, the control block 605 forms the address in conformity with timings of signal processing. In the repeated decoding at even number times, values of reading the interleave pattern in an address order of the interleave pattern memory, are used as the read address of the input signal memory and the read address and the write address of the decoded result memory. The control block 605 forms the address in compliance with timings of signal processing with regard to the respective memory.

Here, an explanation will be given of the constitution of the SOVA decoder 602 in reference to FIG. 1. The SOVA decoder 602 includes an ACS (Add-Compare-Select) signal processor 607 for calculating reliability of transition (metric value), transition information (path value) and reliability information (likelihood value) corresponding to a difference of the reliability of transition until reaching a certain state for all state transition, a metric memory 608, a path memory 609 and a likelihood memory 610 for respectively storing the metric value, the path value and the likelihood value calculated by the ACS circuit 607, and a trace back circuit 611 for tracking a locus of the most reliable transition from the path value obtained from the path memory 609.

Figure 9:
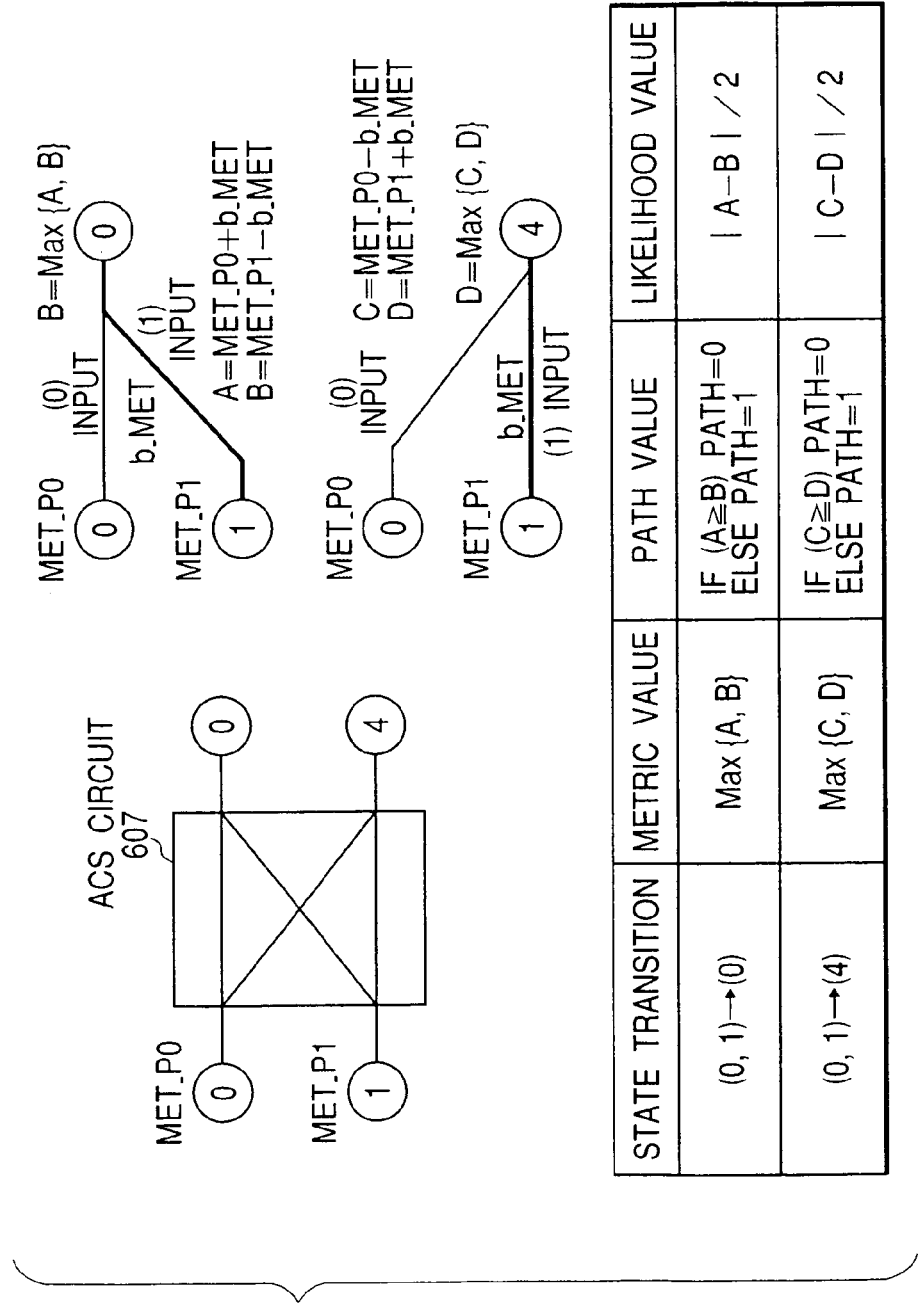
FIG. 9 is a diagram for explaining an ACS circuit used in the turbo decoder shown by FIG. 1.

First, FIG. 9 shows an example of operation of the ACS circuit 607. The ACS circuit 607 calculates reliability b_met of branch for respective transition branch with regard to a basic structure (butterfly) of state transition as a function of C0, C1 and C2 of inputs of the SOVA decoder. The function becomes a function in accordance with a constitution of an encoder and is represented by the following equation (1), for example, in the case of an example of specification of a turbo coder of Release '99 suggested by International Committee 3 GPP (Third generation Partnership).

$$B\_met = C0 + C1 + C2 : (State[0] \wedge State[1] = 0) \quad (1)$$
$$= -C0 + C1 - C2 : (State[1] \wedge State[1] = 1)$$

where state number is expressed by a binary number, 1-th bit of LSB (Least Significant Bit) is indicated by state [0], 2-th bit is indicated by State [1] and ^ indicates an exclusive OR logic.

The ACS circuit 607 loads metric values MET_P0 and MET_P1 calculated by the ACS circuit 607 with regard to a state of 1 bit earlier to thereby constitute metric values for respective state. In a certain state, updating of the metric values of branches executed with regard to two branches which can transit (transit from (0, 1) to (0), transit from (0,1) to (4) in FIG. 9), is carried out by A=MET_P0+b_met, B=MET_P1−b_met, C=MET_P0−b_met and D=MET_P1+b_met. In this case, respectively Max {A,B} and Max {C,D} are left as metric values and a branch indicating the most reliable transition is stored as path value. Absolute values of differences of metric value with regard to the two transition branches (respectively, |A-B|/2, and |C-D|/2) are defined as likelihood values in the state.

The ACS circuit 607 calculates the metric value, the path value and the likelihood value with regard to all states as described above and stores the values respectively to the metric memory 608, the path memory 609 and the likelihood memory 610. However, in order to avoid saturation of the metric value, the ACS circuit 607 stores a metric value having a maximum value at a processing of 1 bit earlier and the stored metric value is subtracted from the respective metric value and the subtracted value is stored to the metric memory 607.

Figure 10:
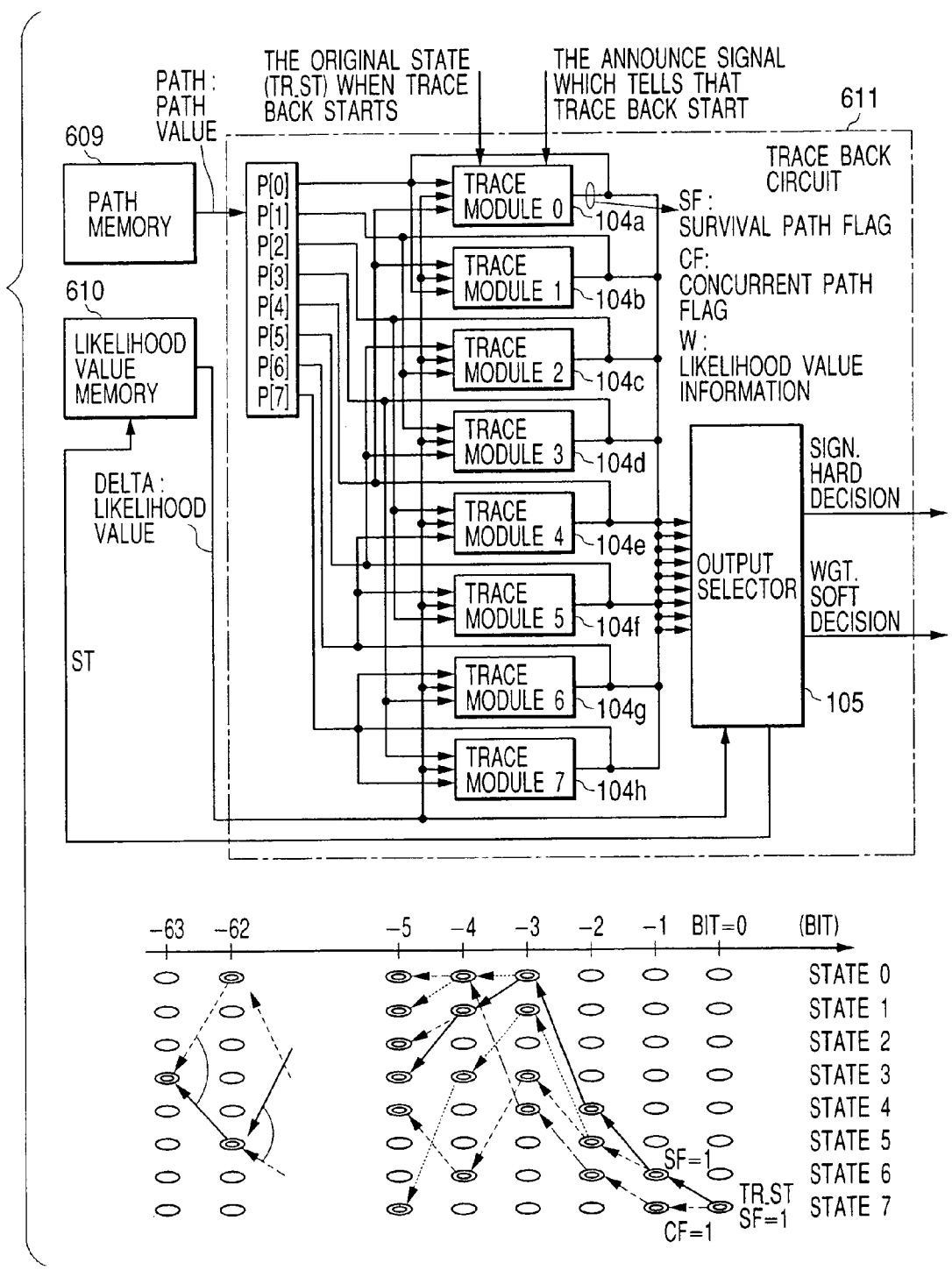
FIG. 10 is a constitution diagram for explaining a trace back circuit used in the turbo decoder shown by FIG. 1.

FIG. 10 shows a constitution example of the trace back circuit. The trace back circuit 611 sets a trace back starting state TR_ST as an initial state when a trace back start signal TR_LD is set to be "1" and calculates hard decision SIGN and soft decision WGT by using the path value read from the pass memory 609 and the likelihood value read from the likelihood memory 610.

The trace back circuit 611 is constituted by trace modules 104a through 104h in correspondence with numbers of states of path values (PATH) inputted from the path memory 609 (p[0] through P[7]) and an output selector 105. The trace module 104 is a circuit for calculating a survival path flag SF indicating the most reliable transition, a concurrent path flag CF indicating next reliable transition and likelihood value information W representing a difference of reliabilities of the survival path and the concurrent path for respective states. There is constituted a structure in which the information calculated at the respective trace module 104 is fed back to the trace module 104 as information of 1 bit earlier in accordance with trellis state transition (state transition of encoder). The output selector 105 calculates hard decision SIGN and soft decision WGT from output results of the trace modules 104 in respective states.

Figure 11:
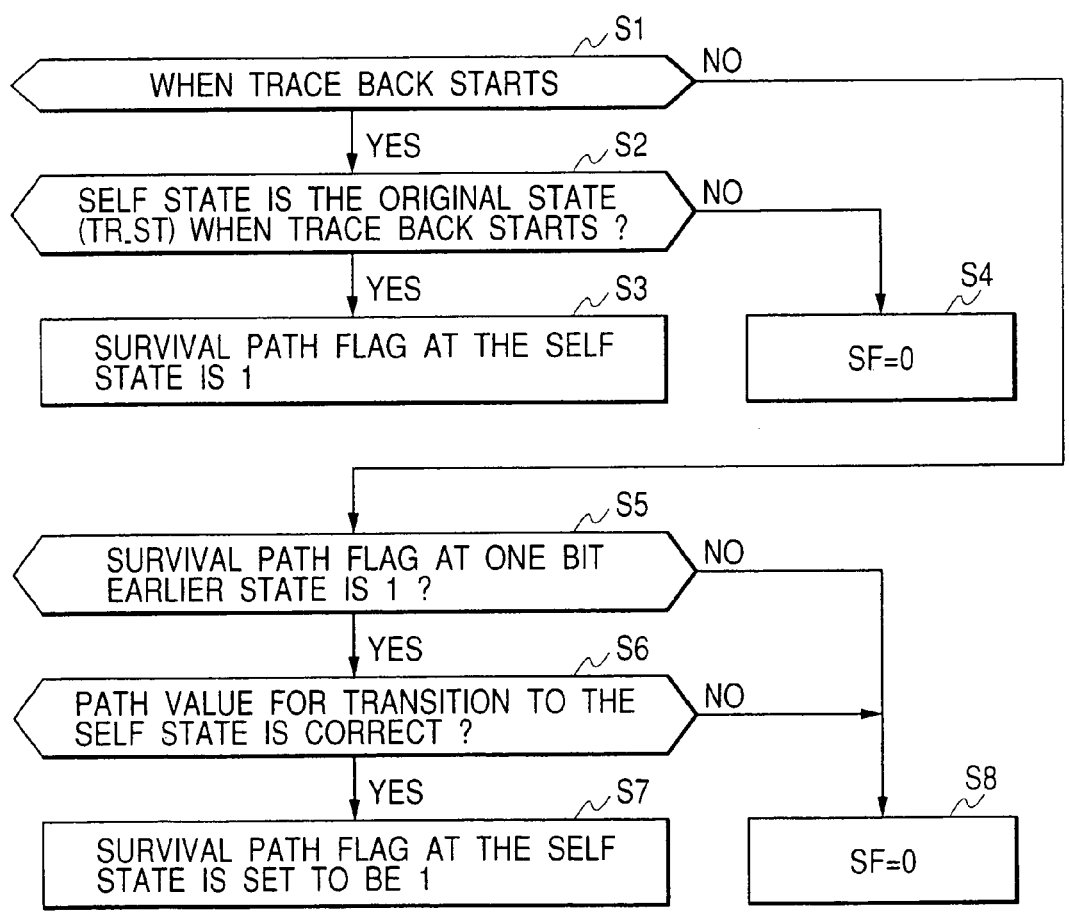
FIG. 11 is a flowchart for explaining a survival path flag decision algorithm in the trace back circuit.

FIG. 11 shows an algorithm for determining the survival path flag SF in the trace module 104 of the trace back circuit 611. When trace back is started, the ACS circuit 607 defines a state having the largest metric value as a trace back starting state TR_ST and sets flag such that the survival path flag SF from the trace module 104 in correspondence with the state TR_ST becomes 1.

First, when trace back is started, that is, when the trace back starting signal TR_LD is 1 (step S1), when a self state is the trace back starting state TR_ST (step S2), the self state becomes the survival path and the survival path flag SF becomes 1 (step S3). When the self state is not the trace back starting state TR_ST at step S2, the survival path flag SF becomes 0 (step S4).

In the case in which the trace back starting signal TR_LD is not 1 at step S1, when in the trace back processing, a path transmitting from a state in which the survival path flag SF has been 1 at time point of 1 bit earlier (step S5) to the self state, transits correctly in comparison with the path value read from the path memory (step S6), the self state is succeeded as the survival path and the survival path flag SF becomes 1 (step S7). When the survival path flag SF is not 1 at the time point of 1 bit earlier at step S5, and when the path transmitting to the self state is not correct at step S6, the survival path flag SF becomes 0 (step S8).

Figure 12:
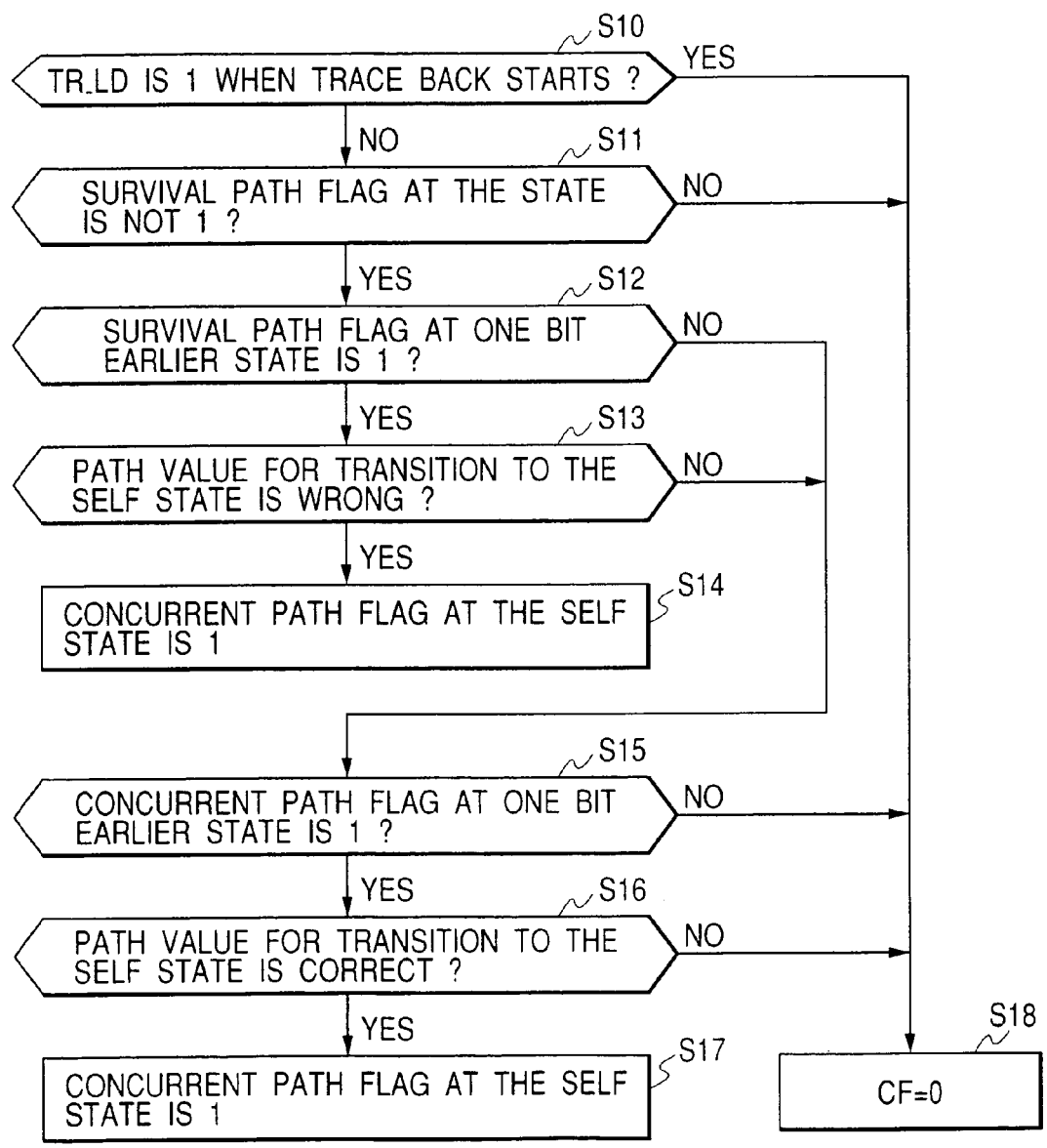
FIG. 12 is a flowchart for explaining a concurrent path flag decision algorithm in the trace back circuit.

Next, FIG. 12 shows an algorithm for determining the concurrent path flag CF in the trace module 104 of the trace back circuit 611. First, when trace back is started, that is, when the trace back starting signal TR_LD is 1 (step S10), there is not present a concurrent path with regard to all states and accordingly, the concurrent path flag CF is reset to 0 (step S18). Further, after the trace back has been started (step S10), in the case in which the self state is a survival path (step S11), the self state cannot be a concurrent path and therefore, the concurrent path flag CF becomes 0 (step S18). At step S11, when the self state is not a survival path (step S11), as a condition by which the self state becomes a concurrent path, with regard to a path transmitting from a state which has been a survival path at 1 bit earlier (step S12) to the self state, when the path is not correct in comparison with the path value read from the path memory (step S13), the concurrent path flag CF becomes 1 (step S14).

Further, when the self state is not a survival path at 1 bit earlier at step S12, or when the path value transmitting to the self state is not correct at step S13, in the case in which the self state has been a concurrent path at 1 bit earlier (step S15), when a path transmitting from the state to the self state is correct in comparison with the path value read from the path memory (step S16), the concurrent path is succeeded and the concurrent path flag CF becomes 1 (step S17). When the self state is not a concurrent path at 1 bit earlier at step S15, or when the path transmitting to the self state is not correct at step S16, the concurrent path flag CF becomes 0 (step S18).

A lower portion of FIG. 10 shows an embodiment in which the trace back algorithm is applied while calculating the survival path flag SF and the concurrent path flag CF for respective states.

Figure 13:
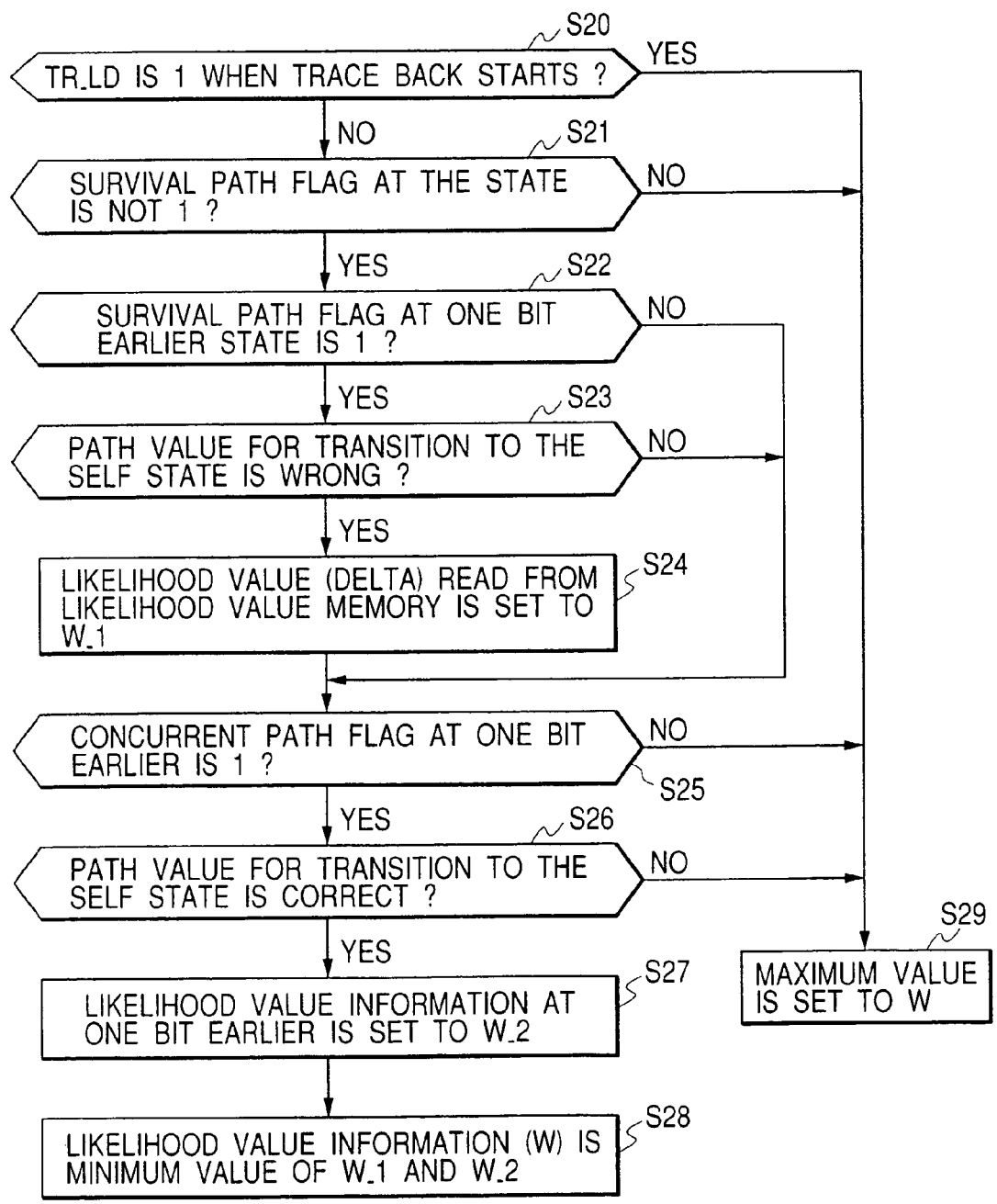
FIG. 13 is a flowchart for explaining a reliability decision algorithm in the trace back circuit.

Successively, FIG. 13 shows an algorithm of determining reliability information W at the trace module 104 of the trace back circuit 611. First, when trace back is started, that is, when the trace back starting signal TR_LD is 1 (step S20), the reliability information is set to a maximum value (step S29). Further, when the trace back has been started (step S20), also in the case in which the self state is a survival path (step S21), the reliability information is set to the maximum value (step S29). In the case in which the self state is not a survival path at step S21, when a path transmitting from a state which has been a survival path at 1 bit earlier (step S22) to the self state, is not correct in comparison with the path value read from the path memory (step S23), a reliability value (DELTA) read from a likelihood value memory in a state which has been a survival path, is held as a candidate W_1=DELTA of reliability information.

When the reliability value DELTA is held at step S24 or when the self state is not a survival path at 1 bit earlier at step S22, or when the path transmitting to the self state is correct at step S23, in the case in which a path transmitting from a state which has been a concurrent path at 1 bit earlier (step S25), is correct in comparison with the path value read from the path memory (step S26), reliability information W at 1 bit earlier in a state of concurrent path (1 bit earlier) is held as a candidate W_2=W (1 bit earlier) reliability information (step S27). Successively, the candidates W_1 and W_2 of reliability information are compared and a smaller value is outputted as reliability information W=Min (W_1, W_2) in the self state (step S28). When the state of 1 bit earlier at step S25 is not a concurrent path, or when the path transmitting to the self state is not correct at step S26, the reliability information is set to the maximum value (step S29).

Figure 14:
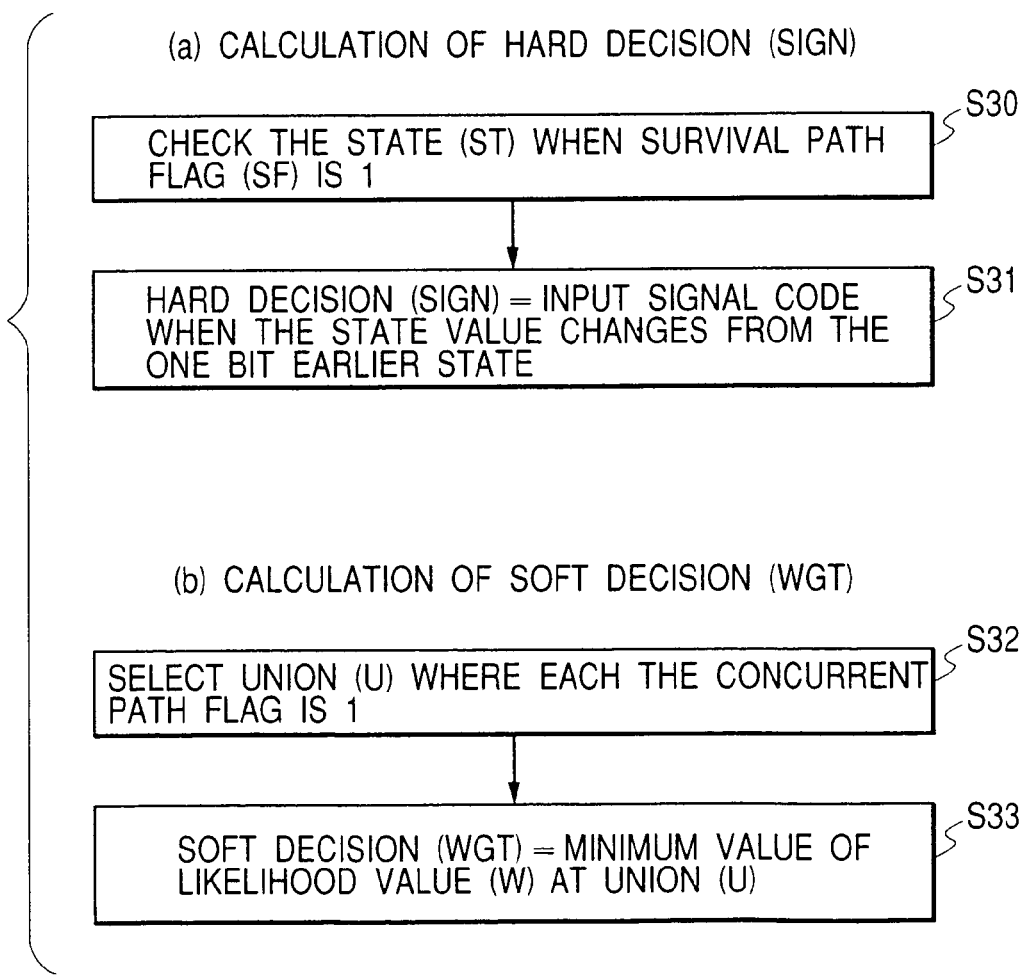
FIG. 14A is a flowchart for explaining a hard decision algorithm.
FIG. 14B is a flowchart for explaining a soft decision algorithm in the trace back circuit.

Finally, FIGS. 14A and 14B show algorithms of calculating the hard decision value SIGN and the soft decision value WGT at the output selector 105 of the trace back circuit 611. In order to calculate the hard decision value SIGN, as shown by FIG. 14A, there is selected a state ST in which the survival path flag SF=1 (step S30) and when a state of a survival path at 1 bit earlier transits to the state ST, a code inputted by the encoder is outputted as the hard decision SIGN (step S31). When the path value is defined as the code inputted by the encoder, the path value at the state ST is outputted as the hard decision value SIGN. Next, in order to calculate the soft decision value WGT, as shown by FIG. 14B, there is calculated a Union U of states in which the concurrent path flag CF=1 (step S32). A minimum value of the reliability information W of the trace module 104 belonging to the union U is outputted as a soft decision value WGT (step S33).

By using the soft decision value WGT provided in this way, the reliability judgment block 612 judges the reliability of the decoded result and based on the judgment result, the control block 604 controls to continue or finish the repeated decoding operation.

Figure 15:
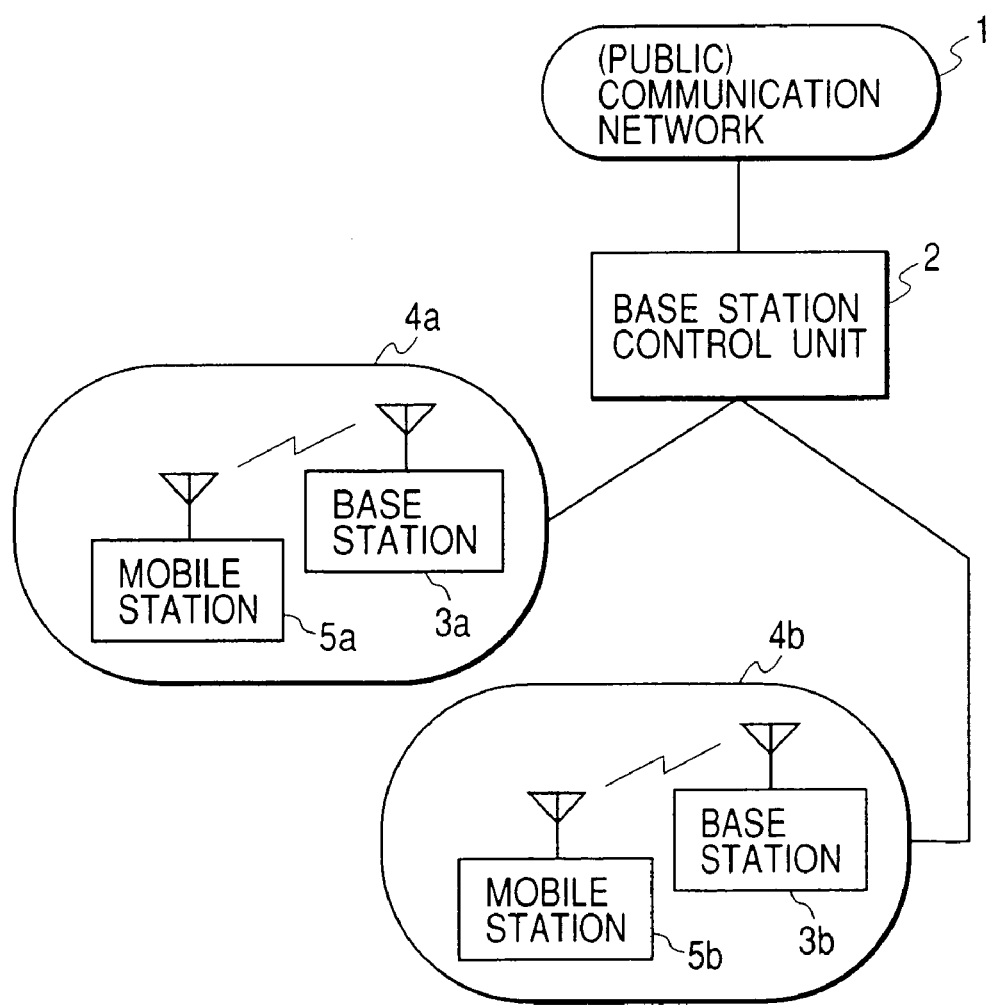
FIG. 15 is a constitution diagram for explaining an example of a mobile communication system introducing the turbo decoder according to the invention.

Next, an explanation will be given of an embodiment of a base station and a mobile station of a mobile communication system introducing an error correction encoding system using the turbo decoder according to the invention. First, as shown by FIG. 15, a base station 3a, 3b is connected to a communication network 1 via a base station control station 2 and when speech is made, a wireless communication channel is set between a mobile station 5a, 5b and the base station 3a, 3b in the wireless zone 4a, 4b of the base station 3a, 3b.

According to the wireless communication channel, there is caused fading accompanied by movement or a rapid increase in transmission loss when the wireless communication channel is disposed behind a building and therefore, code error is liable to cause in transmitted and received data and an effect of applying turbo encoding to a communication system having such a communication channel is enormous.

Figure 16:
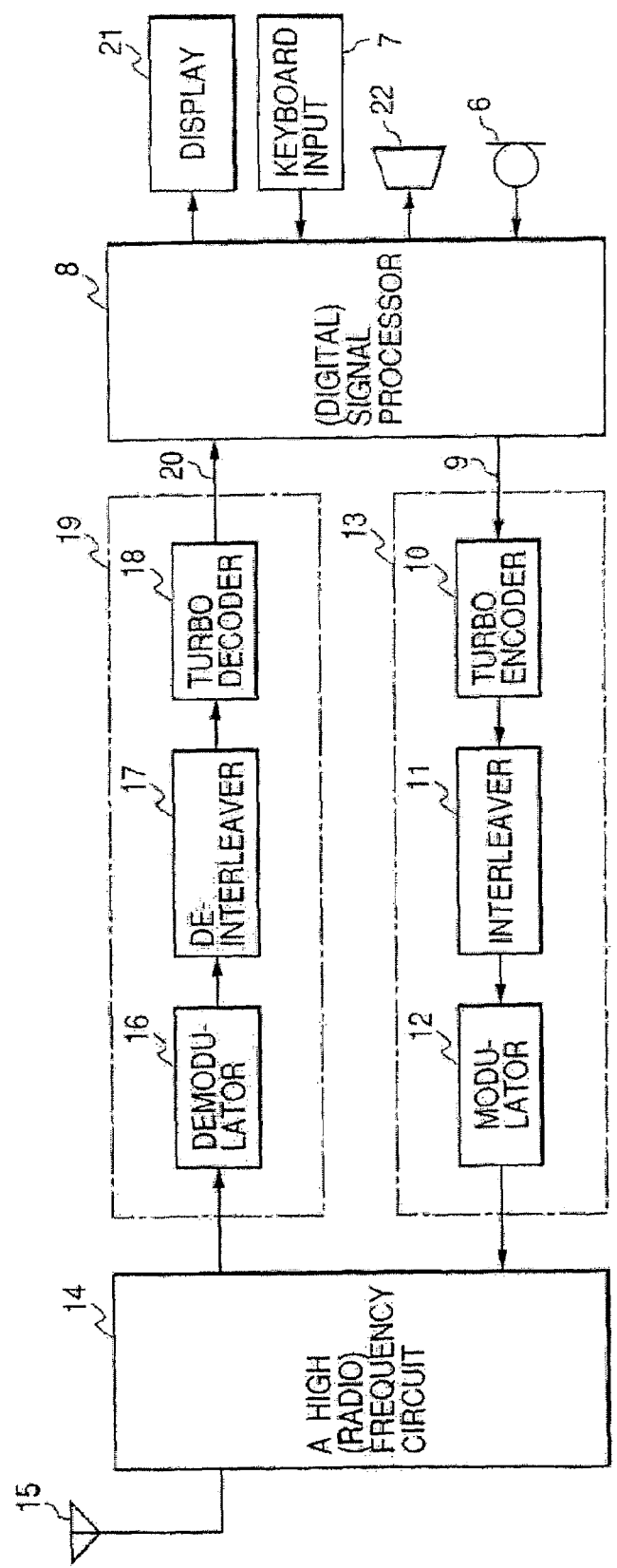
FIG. 16 is a constitution diagram for explaining an embodiment of a mobile station using the turbo decoder according to the invention.

FIG. 16 shows a constitution example of the mobile station 5 for transmitting and receiving data subjected to error correction by turbo encoding. First, a transmitting side of the mobile station 5 includes a signal processor 8 for generating transmitted data 9 by subjecting a signal inputted from a microphone 6 or a keyboard input 7 to a signal processing, a turbo encoder 10 for turbo-coding the transmitted data 9 and outputting encoded data, an interleaver 11 for rearranging data of the encoded data, a modulator 12 for modulating the interleaved encoded data and outputting a transmitted signal, a radio frequency circuit 14 for converting the transmitted signal into a radio frequency signal and an antenna 15 for radiating the radio frequency signal to the wireless zone 4 toward the base station 3.

Although the interleaver 11 is prepared in order that when error is continuously caused in transmitting data, the error is spread widely, depending on the characteristic of the communication channel, the interleaver 11 is not needed. Further, the modulator 12 becomes a spreader for spreading the encoded data by a spread code when the communication system is, for example, a CDMA (Code Division Multiple Access) system and the transmitted signal becomes a spread signal. A transmitter 13 is constituted by the turbo encoder 10, the interleaver 11 and the modulator 12.

A receiving side of the mobile station 5 includes the radio frequency circuit 14 for converting the radio frequency signal from the base station 3 received by the antenna 15 into a received signal, a demodulator 16 for demodulating the received signal and outputting interleaved encoded data, a de-interleaver 17 for rearranging the interleaved encoded data in an original order, a turbo decoder 18 for decoding encoded data outputted by the de-interleaver 17 and outputting received data 20 and the signal processor 8 for subjecting the received data 20 to a signal processor and supplying an output signal thereof to a display 21 or a speaker 22.

The demodulator 16 becomes a despreader when the communication system is the CDMA system, and the received signal becomes a spread signal. The turbo decoder 18 is the turbo decoder according to the invention shown in FIG. 1. A receiver 19 is constituted by the demodulator 16, the de-interleaver 17 and the turbo decoder 18.

Figure 17:
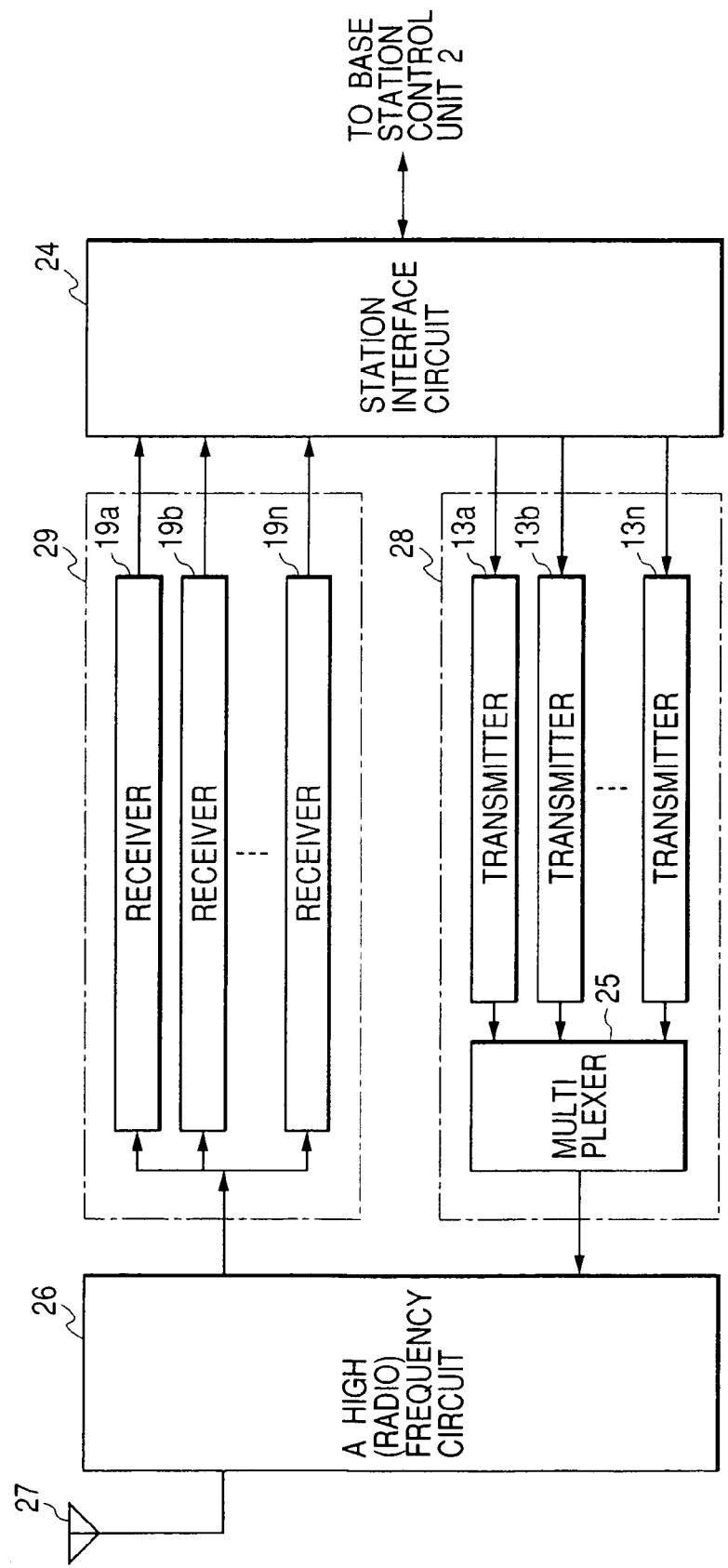
FIG. 17 is a constitution diagram for explaining an embodiment of a base station using the turbo decoder according to the invention.
Figure 18:
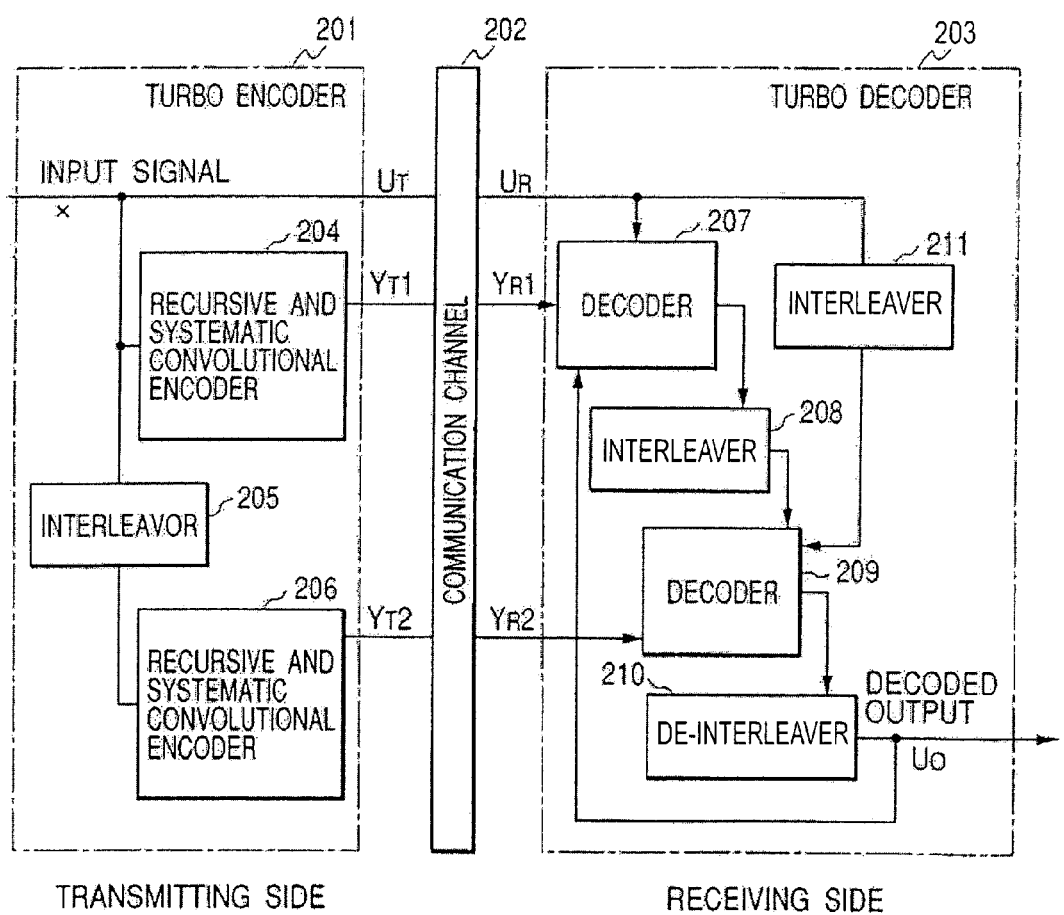
FIG. 18 is a constitution diagram for explaining a communication system using a turbo code and a conventional turbo decoder.

Successively, FIG. 17 shows a constitution example of the base station 3 forming the wireless communication channel between the base station 3 and the mobile station 5. First, a transmitting side of the base station 3 includes transmitters 13a, 13b through 13n for constituting transmitted signals by a plurality of data transmitted from the base station control system 2 via a station interface circuit 24, a multiplex circuit 25 for multiplexing the transmitted signals derived from the respective transmitters, a radio frequency circuit 26 for converting the multiplexed transmitted signals into radio frequency signals and an antenna 27 for radiating the radio frequency signals to the wireless zone 4 toward the plurality of mobile stations 5.

Each of the transmitters 13a, 13b through 13n is provided with a constitution the same as that of the transmitter 13 shown in FIG. 16 and includes the turbo encoder. A multichannel transmitter 28 is constituted by the transmitters 13a, 13b through 13n and the multiplex circuit 25.

A receiving side of the base station 3 includes the radio frequency circuit 26 for converting radio frequency signals from the plurality of the mobile stations 5 received by the antenna 27 into received signals, a plurality of receivers 19a, 19b through 19n for constituting the received data by the plurality of received signals derived from the radio frequency circuit 26 and the station interface circuit 24 for transmitting the plurality of received data to the communication network 1 via the base station control station 2.

Each of the receivers 19a, 19b through 19n is provided with a constitution the same as that of the receiver 19 shown in FIG. 16 and includes the turbo decoder according to the invention shown by FIG. 1. A multichannel receiver 29 is constituted by the receivers 19a, 19b through 19n.

According to the invention, a mean number of times of repeated decoding necessary for turbo decoding can be reduced without deteriorating error correction capability. As a result, a decoding processing amount can be reduced and power consumption can be reduced.

It is further understood by those skilled in the art that the foregoing description is a preferred embodiment of the disclosed device and that various changes and modifications may be made in the invention without departing from the spirit and scope thereof.

What is claimed is:

1. A turbo decoder comprising:
   a decoder for inputting data turbo-coded for correcting an error and repeatedly carrying out soft output decoding to thereby restore original data;
   judging means for judging a reliability of a soft output decoding result from said decoder provided by the soft output decoding from statistics of the soft output decoding result; and
   controlling means for controlling the number of iterations of the soft output decoding based on a result of judgment, by said judging means, of the reliability of the soft output decoding result from said decoder,
   wherein said judging means uses a mean value and a dispersion value of the soft output decoding result from said decoder as the statistics for judging the reliability of the soft output decoding result from said decoder.

2. A turbo decoder comprising:
   a decoder for inputting data turbo-coded for correcting an error and repeatedly carrying out soft output decoding to thereby restore original data;
   judging means for judging a reliability of a soft output decoding result from said decoder provided by the soft output decoding from statistics of the soft output decoding result; and
   controlling means for controlling the number of iterations of the soft output decoding based on a result of judgment, by said judging means, of the reliability of the soft output decoding result from said decoder,
   wherein said judging means uses a mean value and a minimum value of the soft output decoding result from said decoder as the statistics for judging the reliability of the soft output decoding result from said decoder.

3. A turbo decoder comprising:
   a decoder for inputting data turbo-coded for correcting an error and repeatedly carrying out soft output decoding to thereby restore original data;
   judging means for judging a reliability of a soft output decoding result from said decoder provided by the soft output decoding from statistics of the soft output decoding result; and
   controlling means for controlling the number of iterations of the soft output decoding based on a result of judgment, by said judging means of the reliability of the soft output decoding result from said decoder,
   wherein said judging means uses a maximum value and a minimum value of the soft output decoding result from said decoder as the statistics for judging the reliability of the soft output decoding result from said decoder.

4. A mobile station of a mobile communication system, said mobile station comprising:
   a radio frequency circuit for receiving a radio frequency signal of data turbo-coded for correcting an error by an antenna and outputting a received signal;
   a receiver for outputting original data from the received signal as received data; and
   a signal processor for subjecting the received data to a signal processing;
   the receiver further comprising:
   a turbo decoder for decoding the turbo-coded data constituting the received signal for outputting the received data,
   the turbo decoder comprising:
   a decoder for inputting the turbo-coded data and repeatedly carrying out soft output decoding to thereby restore the original data;
   judging means for judging a reliability of a soft output decoding result from said decoder provided by the soft output decoding from statistics of the soft output decoding result, and
   controlling means for controlling the number of iterations of the soft output decoding based on a result of judgment, by said judging means, of the reliability of the soft output decoding result from said decoder,
   wherein said judging means uses, as the statistic for judging the reliability, one of:
   a mean value and a dispersion value of the soft output decoding result from said decoder,
   a mean value and a minimum value of the soft output decoding result from said decoder, and
   a maximum value and a minimum value of the soft output decoding result from said decoder.

5. A base station of a mobile communication system, said base station comprising:
   a radio frequency circuit for receiving a radio frequency signal of data turbo-coded for correcting an error by an antenna and outputting a received signal;
   a receiver for outputting original data from the received signal as received data; and
   a station interface circuit for transmitting the received data to a communication network,
   the receiver comprising:
   a turbo decoder for decoding the turbo-coded data and outputting the received data,
   the turbo decoder comprising:
   a decoder for inputting the turbo-coded data constituting the received signal and repeatedly carrying out soft output decoding to thereby restore the original data,
   judging means for judging a reliability of a soft output decoding result from said decoder provided by the soft output decoding from statistics of the soft output decoding result, and
   controlling means for controlling the number of iterations of the soft output decoding based on a result of judgment, by said judging means, of the reliability of the soft output decoding result from said decoder,
   wherein said judging means uses, as the statistic for judging the reliability, one of:
   a mean value and a dispersion value of the soft output decoding result from said decoder,
   a mean value and a minimum value of the soft output decoding result from said decoder, and
   a maximum value and a minimum value of the soft output decoding result from said decoder.

* * * * *